United States Patent
Samir et al.

(10) Patent No.: US 9,842,748 B2
(45) Date of Patent: Dec. 12, 2017

(54) FLOW CONTROLLED LINER HAVING SPATIALLY DISTRIBUTED GAS PASSAGES

(71) Applicant: Applied Materials, Inc., Santa Clara, CA (US)

(72) Inventors: Mehmet Tugrul Samir, Mountain View, CA (US); Shu-Kwan Lau, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/407,622

(22) Filed: Jan. 17, 2017

(65) Prior Publication Data

US 2017/0125265 A1     May 4, 2017

Related U.S. Application Data

(62) Division of application No. 14/259,898, filed on Apr. 23, 2014, now Pat. No. 9,553,002.

(Continued)

(51) Int. Cl.
    *H01L 23/48*        (2006.01)
    *H01L 21/67*        (2006.01)
               (Continued)

(52) U.S. Cl.
    CPC .... *H01L 21/67017* (2013.01); *C23C 16/4401* (2013.01); *C23C 16/455* (2013.01);
               (Continued)

(58) Field of Classification Search
    CPC ................. H01L 21/67017; H01L 21/67253
    See application file for complete search history.

(56) References Cited

U.S. PATENT DOCUMENTS 4,142,004 A * 2/1979 Hauser, Jr. ............ C23C 16/345
                                                           118/725
4,223,048 A * 9/1980 Engle, Jr. ............. C23C 16/509
                                                           117/103

(Continued)

FOREIGN PATENT DOCUMENTS

| JP | 2010263112 A | 11/2010 |
| KR | 1999-0002605 | 1/1999 |
| KR | 2008-0073840 A | 8/2008 |

OTHER PUBLICATIONS

PCT Notification of Transmittal of the International Search Report and the Written Opinion of the International Searching Authority for International Application No. PCT/US2014/034785 dated Aug. 28, 2014; 13 total pages.

(Continued)

*Primary Examiner* — Eliseo Ramos Feliciano
*Assistant Examiner* — Joannie A Garcia
(74) *Attorney, Agent, or Firm* — Patterson + Sheridan LLP (57) ABSTRACT

Embodiments of the present disclosure provide a liner assembly including a plurality of individually separated gas passages. The liner assembly enables tenability of flow parameters, such as velocity, density, direction and spatial location, across a substrate being processed. The processing gas across the substrate being processed may be specially tailored for individual processes with a liner assembly according to embodiment of the present disclosure.

12 Claims, 6 Drawing Sheets

Related U.S. Application Data (60) Provisional application No. 61/817,691, filed on Apr. 30, 2013.

(51) Int. Cl.
  *C23C 16/44* (2006.01)
  *C23C 16/455* (2006.01)

(52) U.S. Cl.
  CPC .. *C23C 16/45519* (2013.01); *H01L 21/67115* (2013.01); *H01L 21/67253* (2013.01); *Y10T 137/87265* (2015.04)

(56) References Cited

U.S. PATENT DOCUMENTS

| | | |
|---|---|---|
| 5,433,780 A | 7/1995 | Ikeda et al. |
| 5,916,369 A | 6/1999 | Anderson et al. |
| 6,500,734 B2 | 12/2002 | Anderson et al. |
| 2002/0025657 A1 | 2/2002 | Anderson et al. |
| 2006/0051940 A1* | 3/2006 | Todd .................. C23C 16/4481 438/478 |
| 2007/0107653 A1 | 5/2007 | Yamada |
| 2008/0210163 A1 | 9/2008 | Carlson et al. |
| 2010/0081284 A1 | 4/2010 | Balakrishna et al. |
| 2010/0240225 A1 | 9/2010 | Sato et al. |
| 2012/0240853 A1 | 9/2012 | Carlson et al. |
| 2012/0267346 A1 | 10/2012 | Kao et al. |

OTHER PUBLICATIONS

Notice of First Office Action dated Jul. 3, 2017 for Chinese Patent Application No. 201480024290.1.

\* cited by examiner

FLOW CONTROLLED LINER HAVING SPATIALLY DISTRIBUTED GAS PASSAGES

CROSS-REFERENCE TO RELATED APPLICATIONS

This is a divisional application of U.S. application Ser. No. 14/259,898, filed Apr. 23, 2014, which claims benefit of U.S. Provisional Patent Application Ser. No. 61/817,691, filed Apr. 30, 2013, each of which is herein incorporated by reference.

BACKGROUND

Field

Embodiments of the present disclosure generally relate to apparatus and methods for processing semiconductor substrates. Particularly, embodiments of the present disclosure relate to apparatus and methods for improved gas flow distribution in a process chamber.

Description of the Related Art

Some processes for fabricating semiconductor devices, for example rapid thermal processing, epitaxial deposition, chemical vapor deposition, physical vapor deposition, electron-beam curing, are performed at elevated temperatures. Usually substrates being processed are heated to a desired temperature in a process chamber by one or more heat sources. The one or more heat sources are typically mounted outside the chamber body so that the energy generated by the heat sources radiates upon the substrates positioned within the chamber body. Processing gases are usually supplied to the chamber from a gas inlet, and are kept flowing within the chamber body by a pumping system connected to the process chamber. Gas distribution in a conventional chamber is not uniform across the entire process area. For example, gas distribution near the gas inlet is different from gas distribution near the pumping port, and gas distribution near the edge region is different from gas distribution near the center region. Although continuous rotation of the substrate may reduce the non-uniformity of gas distribution, rotation alone may not be enough as the requirement for uniformity increases.

Therefore, there is a need for a thermal process chamber with improved gas flow distribution.

SUMMARY

Embodiments of the present disclosure generally provide apparatus and methods for processing one or more substrates at elevated temperatures. Particularly, embodiments of the present disclosure relate to apparatus and methods for distributing one or more processing gases to a process chamber.

One embodiment of the present disclosure provides a liner assembly for protecting an inner surface of a substrate process chamber. The liner assembly includes a ring shaped body having an outer surface sized to be received by the inner surface of the substrate process chamber and an inner surface defining a substrate processing volume. The ring shaped body includes a plurality of gas passages connecting the outer surface to the substrate processing volume, and each of the plurality of gas passages is designed to connect with a gas inject and to tune the gas flow.

One embodiment of the present disclosure provides an apparatus for processing a substrate. The apparatus includes a chamber body forming a chamber enclosure, wherein the chamber body includes an inject opening and an exhaust opening formed in opposite sides, and a substrate opening formed between the inject opening and the exhaust opening. The apparatus also includes a gas inlet disposed in the inject opening, a substrate support disposed in the chamber enclosure, and a liner assembly for protecting an inner surface of the chamber body and for tuning a gas flow of the gas inject. The liner comprises a ring shaped body having an outer surface sized to be received by the inner surface of the chamber body and an inner surface defining a substrate processing volume, the ring shaped body includes a plurality of gas passages connecting the outer surface to the substrate processing volume, and each of the plurality of gas passages is designed to connect with a gas inject and to tune the gas flow.

Another embodiment of the present disclosure provides a method for processing a substrate. The method includes directing radiant energy from a plurality of heating elements towards an enclose of a substrate process chamber, and tuning a flow of process gas using a plurality of gas passages formed in a liner assembly disposed in the process chamber. The liner assembly comprises a ring shaped body having an outer surface sized to be received by the inner surface of the chamber body and an inner surface defining a substrate processing volume, the ring shaped body includes a plurality of gas passages connecting the outer surface to the substrate processing volume, and each of the plurality of gas passages is designed to connect with a gas inject and to tune the gas flow.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, for purposes of explanation, numerous specific details are set forth in order to provide a thorough understanding of the present disclosure. In some instances, well-known structures and devices are shown in block diagram form, rather than in detail, in order to avoid obscuring the present disclosure. These embodiments are described in sufficient detail to enable those skilled in the art to practice the disclosure, and it is to be understood that other embodiments may be utilized and that logical, mechanical, electrical, and other changes may be made without departing from the scope of the present disclosure.

Embodiments of the present disclosure provide a liner assembly having a plurality of individually separated gas passages. The liner assembly enables tunability of flow parameters, such as velocity, density, direction and spatial location, across a substrate being processed. The processing gas across the substrate being processed may be specially tailored for each individual process with a liner assembly according to embodiments of the present disclosure. The liner assembly according to embodiments of the present disclosure has the advantages of minimizing pressure drop in the gas injection path compared with traditional liners. One embodiment of the present disclosure includes a liner assembly having angled or shortened flow passages to reduce pressure drop. Another advantage of the liner assembly according to the present disclosure is to provide tailored and/or varied flow conductance in the flow paths. In one embodiment, a liner assembly may include a plurality of gas passages with varied sizes, thus providing varied flow conductance through each of the plurality of gas passages. The spatially distribution of the plurality of gas passages in the liner assembly may also be designed to achieve a tailored flow in the process chamber.

The liner assembly according to embodiments of the present disclosure may have another advantage of preventing multiple processing gases to mix before reaching the vicinity of the substrate being processed. Additionally, the liner assembly according to embodiments of the present disclosure also has the advantage of being able to be manufactured using straight forward methods, such as by gun grilling, diffusion bonding and using welded plugs.

Figure 1A:
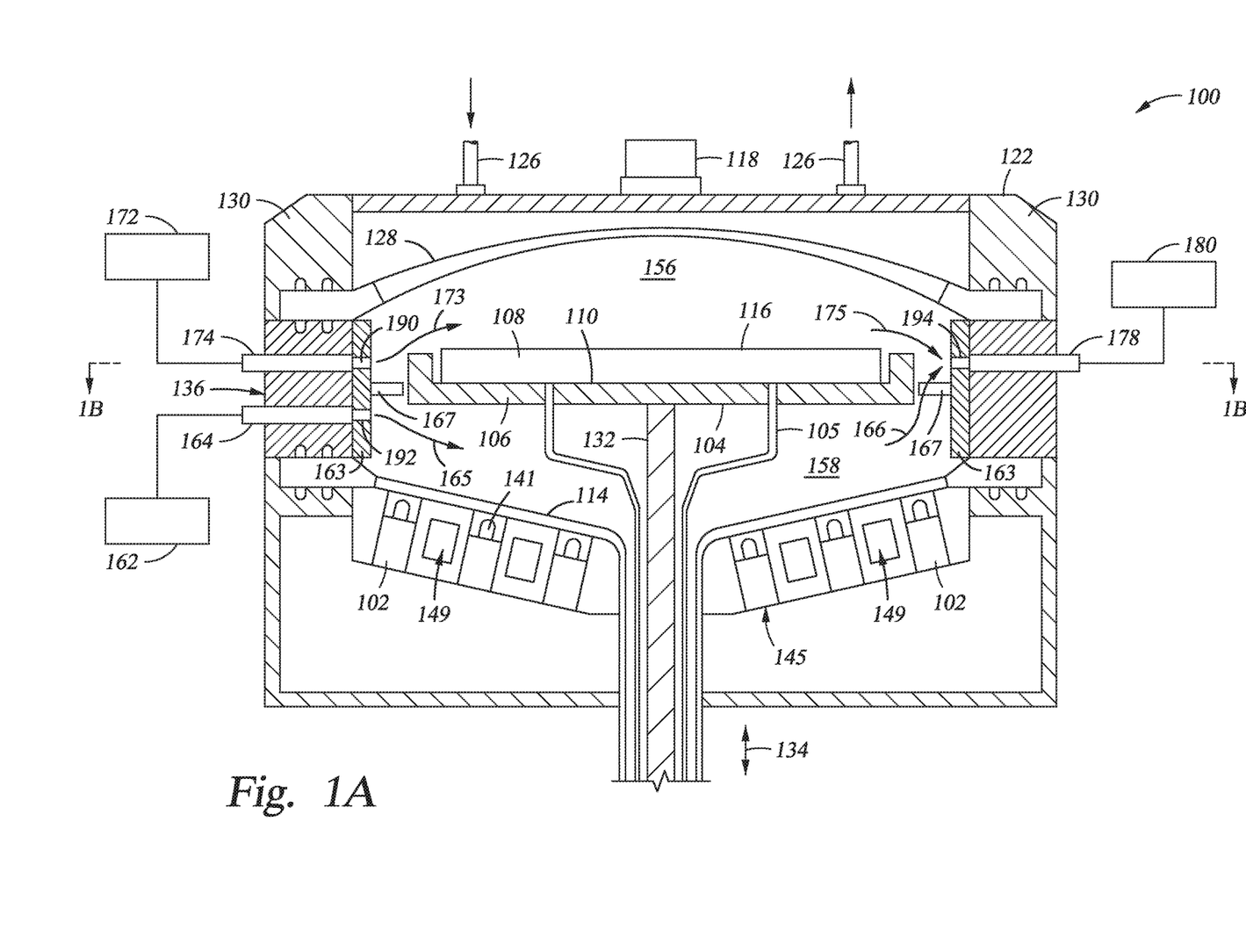
FIG. 1A is a schematic sectional side view of a process chamber according to one embodiment of the present disclosure.
Figure 1B:
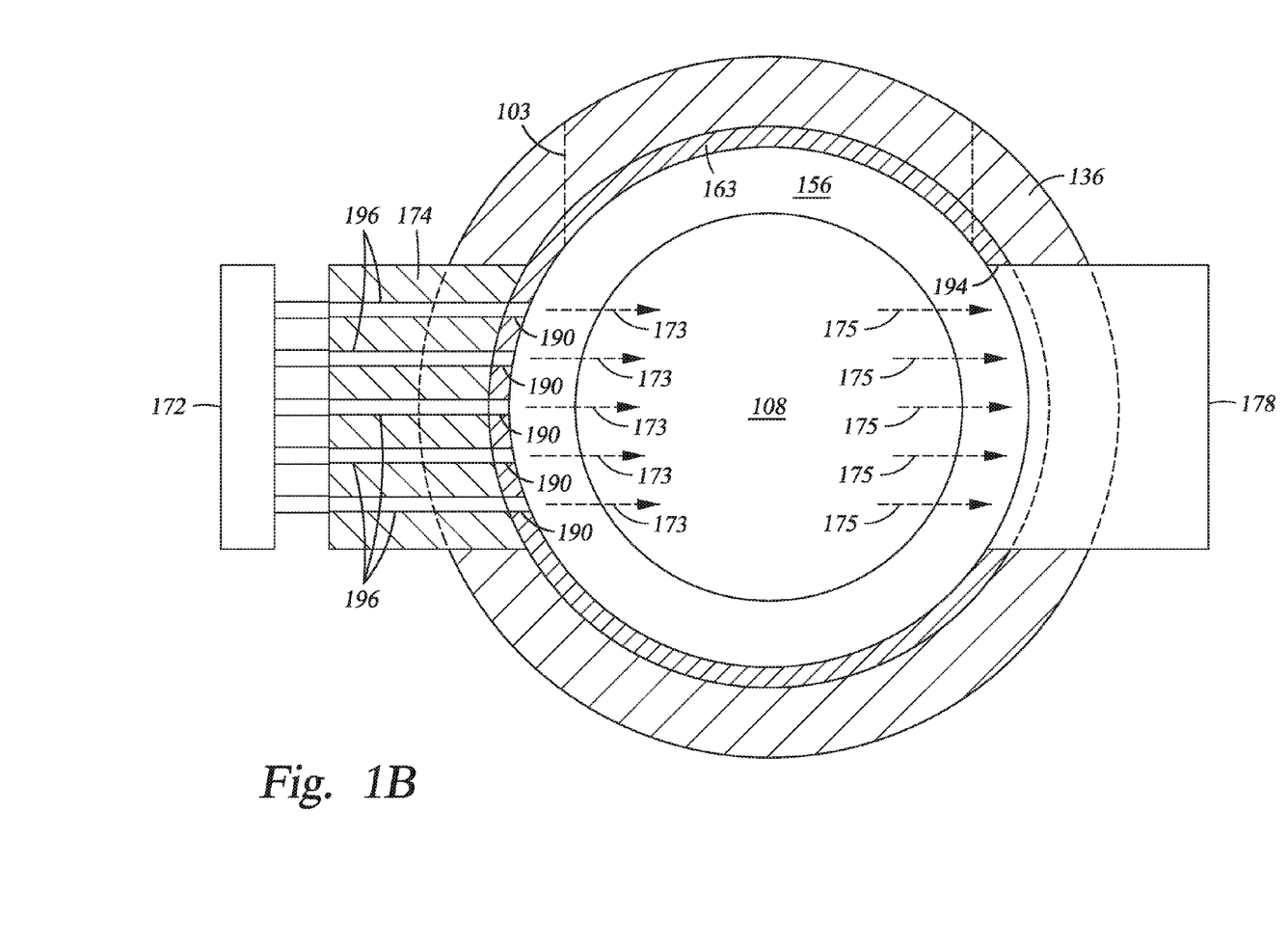
FIG. 1B is a schematic sectional top view of the process chamber of FIG. 1A.

FIG. 1A illustrates a schematic sectional view of a process chamber 100 according to one embodiment of the disclosure. FIG. 1B is a schematic sectional top view of the process chamber 100. The process chamber 100 may be used to process one or more substrates, including the deposition of a material on an upper surface 116 of a substrate 108. The process chamber 100 may include an array of radiant heating lamps 102 for heating, among other components, a back side 104 of a substrate support 106 disposed within the process chamber 100. In some embodiments, the array of radiant heating lamps 102 may be disposed over an upper dome 128. The substrate support 106 may be a disk-like substrate support 106 with no central opening as shown. Alternatively, the substrate support 106 may be a ring-like substrate support, which supports the substrate from the edge of the substrate to facilitate exposure of the substrate to the thermal radiation of the plurality of radiant heating lamps 102.

The substrate support 106 is located within the process chamber 100 between the upper dome 128 and a lower dome 114. A base ring 136 may be disposed between the upper dome 128 and lower dome 114. The upper dome 128, the lower dome 114 and the base ring 136 generally define an internal region of the process chamber 100. The substrate 108 (not to scale) can be brought into the process chamber 100 and positioned onto the substrate support 106 through a loading port 103, shown in FIG. 1B.

In FIG. 1A, the substrate support 106 is shown at a process position. The substrate support 106 may be vertically traversed to a loading position below the process position to allow lift pins 105 to contact the lower dome 114, passing through holes in the substrate support 106 and the central shaft 132, and raise the substrate 108 from the substrate support 106. The substrate support 106, while located in the process position, divides the internal volume of the process chamber 100 into a process gas region 156 that is above the substrate support 106, and a purge gas region 158 that is below the substrate support 106. The substrate support 106 is rotated during processing by a central shaft 132 to minimize the effect of thermal and process gas flow spatial anomalies within the process chamber 100 and thus facilitates uniform processing of the substrate 108. The substrate support 106 is supported by the central shaft 132, which moves the substrate 108 up and down along direction 134 during loading and unloading, and in some instances, during processing of the substrate 108. The substrate support 106 may be formed from silicon carbide or graphite coated with silicon carbide to absorb radiant energy from the radiant heating lamps 102 and conduct the radiant energy to the substrate 108.

In general, the central window portion of the upper dome 128 and the bottom of the lower dome 114 are formed from an optically transparent material such as quartz. One or more lamps, such as an array of radiant heating lamps 102, can be disposed adjacent to and beneath the lower dome 114 in a specified manner around the central shaft 132 to independently control the temperature at various regions of the substrate 108 as the process gas passes over, thereby facilitating the deposition of a material onto the upper surface 116 of the substrate 108. While not discussed here in detail, the deposited material may include gallium arsenide, gallium nitride, or aluminum gallium nitride.

The radiant heating lamps 102 may include bulbs 141 configured to heat the substrate 108 to a temperature within a range of about 200 degrees Celsius to about 1600 degrees Celsius. Each radiant heating lamp 102 is coupled to a power distribution board (not shown) through which power is supplied to each radiant heating lamp 102. The radiant heating lamps 102 may be arranged within a lamp head 145 having lamp receiving openings. The lamp head 145 may be cooled during or after processing by, for example, a cooling fluid introduced into channels 149 located between the radiant heating lamps 102. In one embodiment, the channels 149 in the lamp head 145 may be used to conductively and radiatively cool the lower dome 104 due in part to the close proximity of the lamp head 145 to the lower dome 104. In one embodiment, the lamp head 145 may also cool the lamp walls and walls of the reflectors (not shown) around the lamps. Alternatively, the lower dome 104 may be cooled by a convective approach known in the industry. Depending upon the application, the lamp head 145 may or may not be in contact with the lower dome 114.

A circular shield 167 may be optionally disposed around the substrate support 106. The shield 167 prevents or minimizes leakage of heat/light noise from the radiant heating lamps 102 to the device side 116 of the substrate 108 while providing a pre-heat zone for the process gases. The shield 167 may be made from chemical vapor deposition (CVD) SiC, sintered graphite coated with SiC, grown SiC, opaque quartz, coated quartz, or any similar, suitable material that is resistant to chemical breakdown by process and purging gases.

A liner assembly 163 may be positioned in the process chamber 100. In one embodiment, the liner assembly 163 may surround the circular shield 167. The liner assembly 163 is sized to be nested within or surrounded by an inner circumference of the base ring 136. The liner assembly 163 shields the processing volume (i.e., the process gas region 156 and purge gas region 158) from metallic walls of the process chamber 100. For example, metallic walls from the base ring 136. The metallic walls may react with precursors and cause contamination in the processing volume. While the liner assembly 163 is shown as a single body, the liner assembly 163 may include one or more liners as will be discussed below. According to embodiments of the present disclosure, the liner assembly 163 includes a plurality of gas passages 190 for injecting one or more processing gases to the process gas region 156. The liner assembly 163 may also include a plurality of gas passages 192 for injection one or more gases to the purge gas region 158.

An optical pyrometer 118 may be positioned outside the upper dome 128 to measure temperature of the substrate 108. As a result of backside heating of the substrate 108 from the substrate support 106, the use of the optical pyrometer 118 for temperature measurements/control on the substrate support can be performed. This temperature measurement by the optical pyrometer 118 may also be done on substrate device side, for example the upper surface 116, having an unknown emissivity since heating the substrate back side 110 in this manner is emissivity independent. As a result, the optical pyrometer 118 may detect radiation from the substrate 108 with minimal background radiation from the radiant heating lamps 102 directly reaching the optical pyrometer 118, therefore obtaining accurate temperature measurement of the substrate 108.

A reflector 122 may be optionally placed outside the upper dome 128 to reflect infrared light that is radiating off the substrate 108 back onto the substrate 108. The reflector 122 may be secured to the upper dome 128 using a clamp ring 130. The reflector 122 may be made of a metal such as aluminum or stainless steel. The efficiency of reflection may be improved by coating a reflector area with a highly reflective coating such as with gold. The reflector 122 may have one or more machined channels 126 connected to a cooling source (not shown). The channel 126 connects to a passage (not shown) formed on a side of the reflector 122. The passage is configured to carry a flow of a fluid such as water and may run horizontally along the side of the reflector 122 in any desired pattern covering a portion or entire surface of the reflector 122 for cooling the reflector 122.

One or more process gases from a process gas supply source 172 may be introduced into the process gas region 156 through a process gas inlet 174 disposed in the sidewall of the base ring 136. The process gas inlet 174 may include one or more gas injects 196 (shown in FIG. 1B) to deliver one or more individual gas flows. The process gas inlet 174 may be configured to provide individual gas flows with varied parameters, such as velocity, density, or composition. Each of the one or more gas injects 196 of the process gas inlet 174 is connected one of the plurality of gas passages 190 formed through the liner assembly 163. The plurality of gas passages 190 are configured to direct the process gas in a generally radially inward direction. Each of the plurality of gas passages 190 may be used to adjust one or more parameters, such as velocity, density, direction and location, of the process gas from the process gas inlet 174. The plurality of gas passages 190 tune the one or more process gas from the process gas inlet 174 before directing the one or more process gas to the process gas region 156 for processing.

During processing, the substrate support 106 may be located in the process position as shown in FIG. 1A. In the process position, the substrate 108 is adjacent to and at about the same elevation as the process gas inlet 174, allowing the process gas to flow up and round along flow path 173 across the upper surface 116 of the substrate 108 in a laminar flow fashion. The process gas exits the process gas region 156 (along flow path 175) through an exhaust opening 194 formed through the liner assembly 163 and a gas outlet 178 located on the side of the process chamber 100 opposite the process gas inlet 174. Removal of the process gas through the gas outlet 178 may be facilitated by a vacuum pump 180 coupled to the gas outlet 178. As the process gas inlet 174 and the gas outlet 178 are aligned to each other and disposed approximately at the same elevation, it is believed that such a parallel arrangement of the gas inlet 174 and gas outlet 178, when combining with a flatter upper dome 128, will enable a generally planar, uniform gas flow across the substrate 108. Further radial uniformity may be provided by the rotation of the substrate 108 through the substrate support 106.

Similarly, purge gas may be supplied from a purge gas source 162 to the purge gas region 158 through an optional purge gas inlet 164 or through the process gas inlet 174 disposed in the sidewall of the base ring 136 through the plurality of gas passages 192 formed in the liner assembly 163. The purge gas inlet 164 is disposed at an elevation below the process gas inlet 174. If the circular shield 167 used, the circular shield 167 may be disposed between the process gas inlet 174 and the purge gas inlet 164. In either case, the purge gas inlet 164 is configured to direct the purge gas in a generally radially inward direction. During the film formation process, the substrate support 106 may be located at a position such that the purge gas flows down and round along flow path 165 across back side 104 of the substrate support 106 in a laminar flow fashion. Without being bound by any particular theory, the flowing of the purge gas is believed to prevent or substantially avoid the flow of the process gas from entering into the purge gas region 158, or to reduce diffusion of the process gas entering the purge gas region 158 (i.e., the region under the substrate support 106). The purge gas exits the purge gas region 158 (along flow path 166) and is exhausted out of the process chamber 100 through the gas outlet 178, which is located on the side of the process chamber 100 opposite the purge gas inlet 164.

Similarly, during the purging process the substrate support 106 may be located in an elevated position to allow the purge gas to flow laterally across the back side 104 of the substrate support 106.

FIG. 1B shows the flow paths from the process gas inlet 174 to the gas outlet 178. The plurality of gas passages 190 may be distributed along a portion of the liner assembly 163 to direct the flow paths 173 in a substantially parallel manner. The number, dimension and location of the each of the gas passages 190 may be arranged according to achieve a target flow pattern. The exhaust opening 194 may be a wide opening formed through the liner assembly 163 on the opposite side of the plurality of gas passages 190.

It should be appreciated by those of ordinary skill in the art that the plurality of gas passages 190, 192 are shown for illustrative purposes. The positions, sizes, and number of gas inlets or outlet etc. may be adjusted to further facilitate a uniform deposition of material on the substrate 108. Exemplary embodiments of liner assemblies according to embodiments of the present disclosure are described below.

Figure 2A:
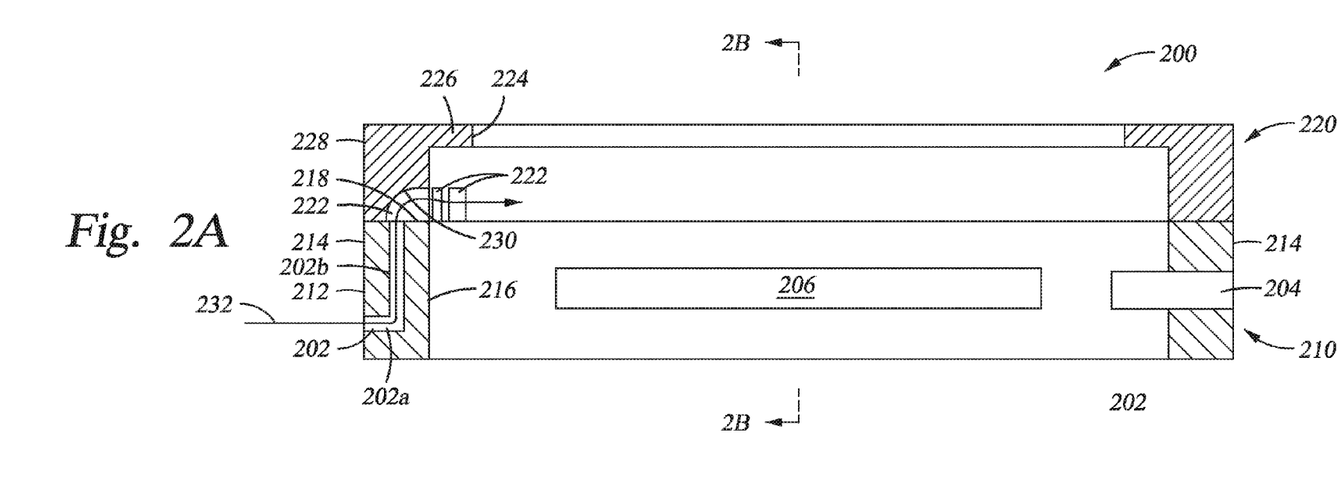
FIG. 2A is a schematic sectional side view of a liner assembly according to one embodiment of the present disclosure.

FIG. 2A is a schematic sectional side view of a liner assembly 200 according to one embodiment of the present disclosure. The liner assembly 200 may include a lower liner 210 and an upper liner 220 disposed above the lower liner 210. A plurality of gas passages 202 may be formed in the lower liner 210. The upper liner 220 may include a plurality of flow guides 222 aligned with the plurality of gas passages 202. Each of the plurality of flow guides 222 is formed to direct the gas flow from the corresponding gas passage 202 to the process gas region 156.

The lower liner 210 may have a ring shaped body 212. The ring shaped body 212 has an outer surface 214 for facing an inner surface of the base ring 136 and an inner surface 216 facing the substrate 108 being processed. The lower liner 210 has an upper surface 218 facing the upper liner 220. The plurality of gas passages 202 and an exhaust opening 204 are formed through opposite sides of the ring shaped body 212. In one embodiment, a substrate opening 206 is formed through the ring shaped body 212 between the plurality of passages 202 and the exhaust openings 204.

Each of the plurality of gas passages 202 may include a horizontal portion 202a and a vertical portion 202b connected to one another. The horizontal portion 202a may be formed by drilling a blind hole from the outer surface 214. The vertical portion 202b may be formed by drilling a blind hole from the upper surface 218 to connect with the horizontal portion 202a.

The upper liner 220 includes a ring shaped body 228 having a lip 226 extending radially inward. The lip 226 defines a central opening 224. The lip 226 is positioned away from the lower liner 210. The ring shaped body 228 has a curved inner surface 230 facing the lower liner 210. The plurality of the flow guides 222 may be formed in the inner surface 230 for directing the gas flow of the gas passages 202. The geometry of the flow guide 222 redirects the flow to achieve a target flow path. Flow paths 232 are schematically illustrated in FIG. 2A.

Figure 2B:
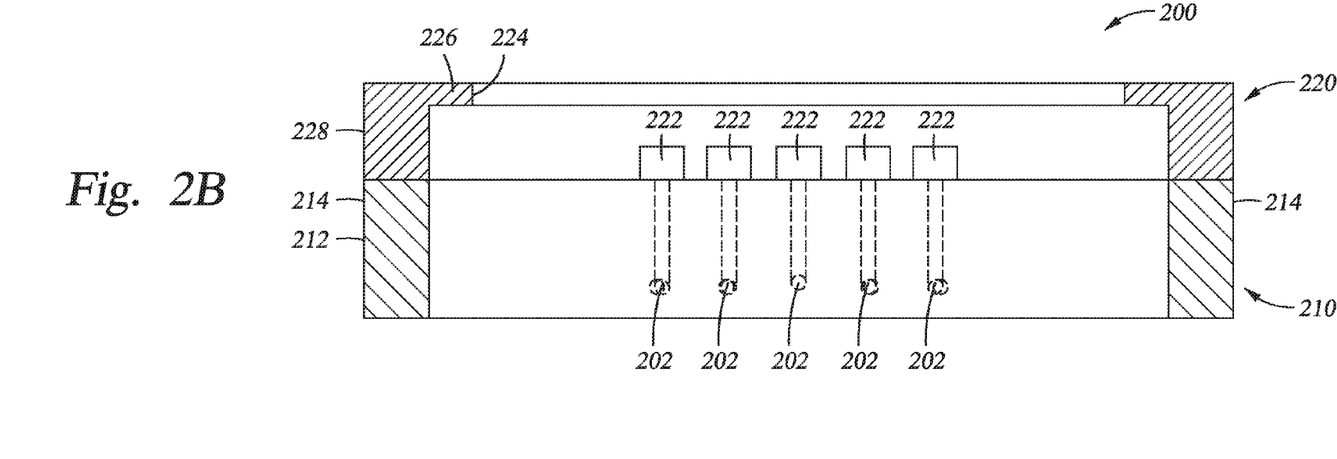
FIG. 2B is a second schematic sectional side view of the liner assembly of Finger 2A.

FIG. 2B is a second schematic section side view of the liner assembly 200 showing the distribution of the gas passages 202 and the flow guide 222 according to one embodiment of the present disclosure.

The upper liner 220 and the lower liner 210 may be formed from a material compatible to processing chemistries. In one embodiment, the upper liner 220 and lower liner 210 may be formed from quartz. The plurality of gas passages 202 may be formed by gun drilling.

Figure 3:
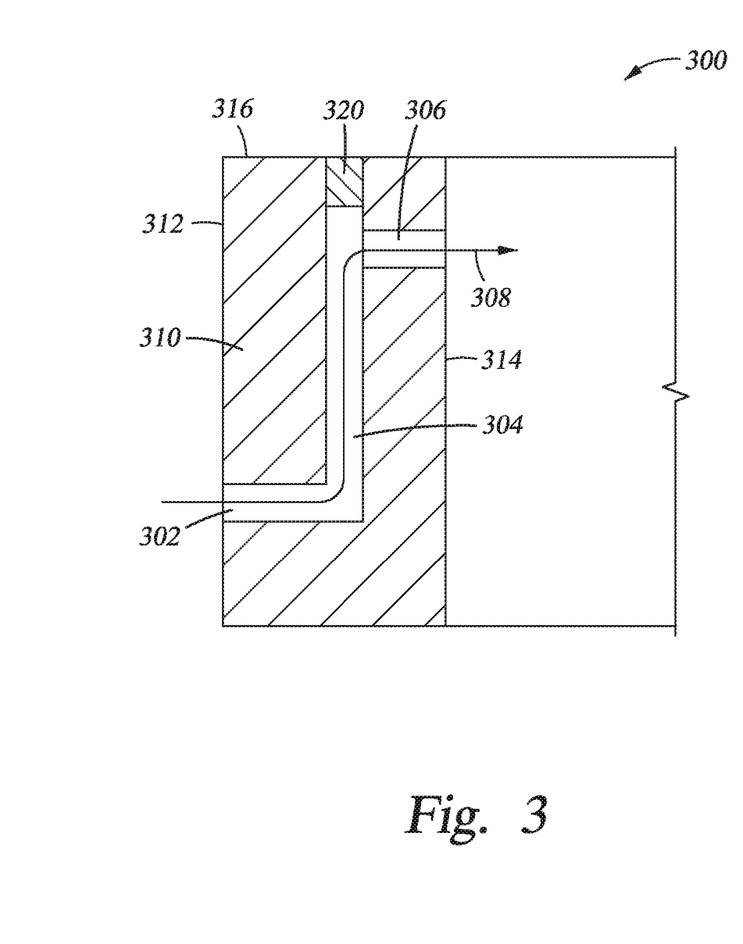
FIG. 3 is a partial sectional side view of a liner assembly according to one embodiment of the present disclosure.

FIG. 3 is a partial sectional side view of a liner assembly 300 according to one embodiment of the present disclosure. The liner assembly 300 includes a ring shaped body 310 having an outer surface 312, an inner surface 314 and an upper surface 316. The ring shaped body 310 defines a plurality of flow paths 308 connecting the outer surface 312 and the inner surface 314. In one embodiment, each of the plurality of flow paths 308 includes three channels 302, 304, 306 formed by drilling blind holes from the outer surface 312, the inner surface 314 and the upper surface 316 respectively. A plurality of inserts 320 may be disposed in each of the channels 304 from the upper surface 316.

Figure 4:
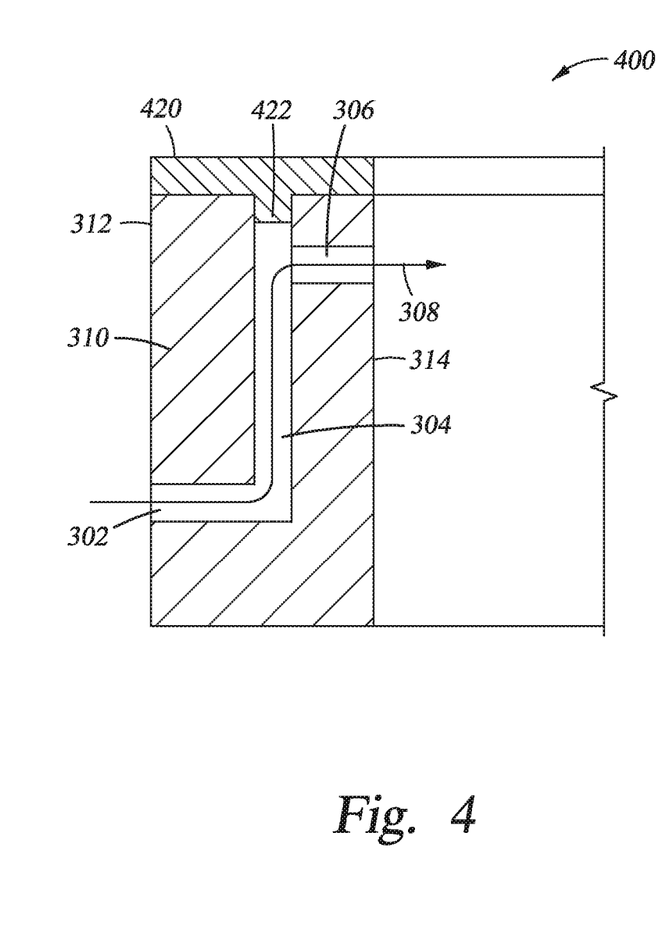
FIG. 4 is a partial sectional side view of a liner assembly according to one embodiment of the present disclosure.

FIG. 4 is a partial sectional side view of a liner assembly 400 according to one embodiment of the present disclosure. The liner assembly 400 is similar to the liner assembly 300 except a cover ring 420 having a plurality of protrusion 422 for plugging the channels 304.

Figure 5A:
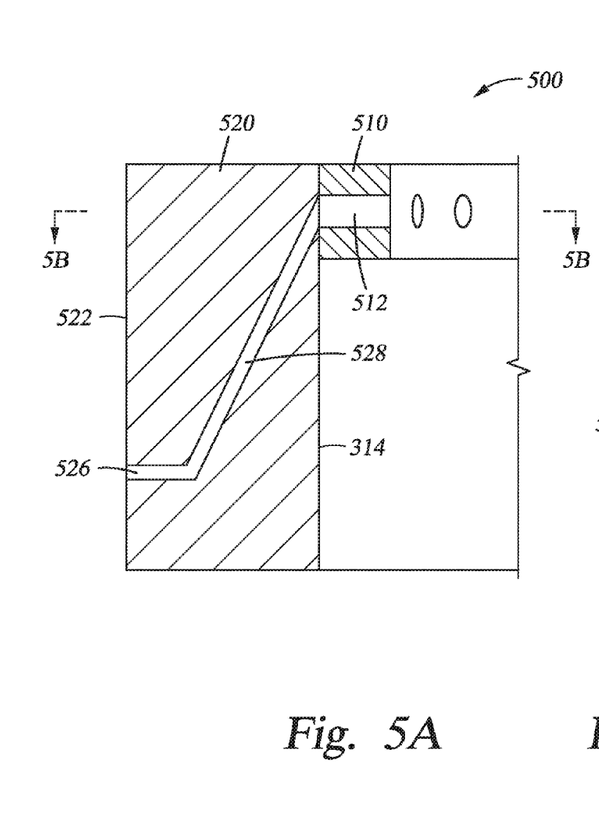
FIG. 5A is a partial sectional side view of a liner assembly according to one embodiment of the present disclosure.
Figure 5B:
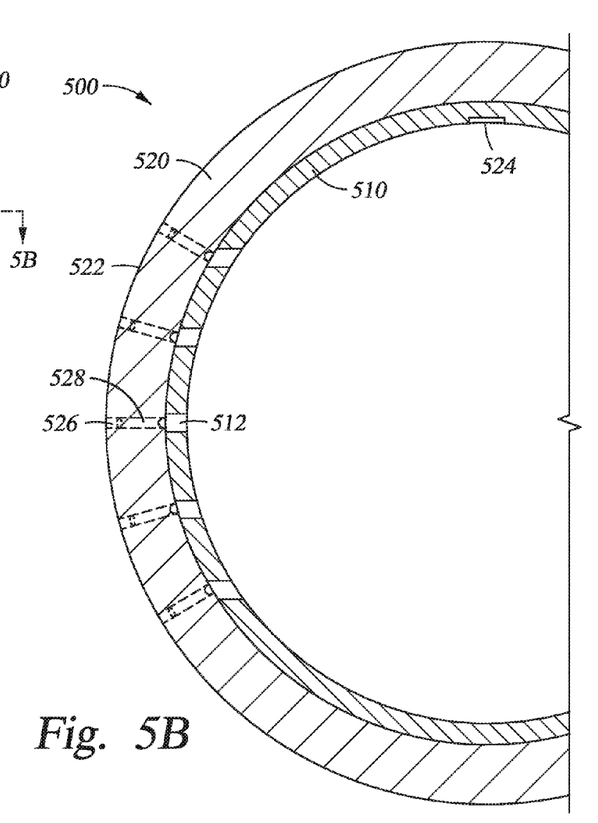
FIG. 5B is a schematic top view of the liner assembly of FIG. 5A.

FIG. 5A is a partial sectional side view of a liner assembly 500 according to one embodiment of the present disclosure. FIG. 5B is a schematic top view of the liner assembly 500. The liner assembly 500 includes a liner body 520 and an inject ring 510. The liner body 520 has a ring shaped body with an outer surface 522 and an inner surface 524. The inject ring 510 is attached to the inner surface 524 of the ring shaped liner body 520. The ring shaped liner body 520 includes a plurality of horizontal channels 526 connecting with a corresponding one of a plurality of slanted channels 528. The horizontal channels 526 may be formed by drilling blind holes from the outer surface 522 and the slanted channels 528 may be formed by drilling slanted blind holes from the inner surface 524 to connect with the horizontal channel 526. The inject ring 510 includes a plurality of horizontal channels 512 aligned with the plurality of slanted channels 528. The slanted channels 528 direct the gas flow upwards with reduced resistance. The inject ring 510 allows the easy manufacturing of the slanted channels 528 in the flow paths.

Figure 5C:
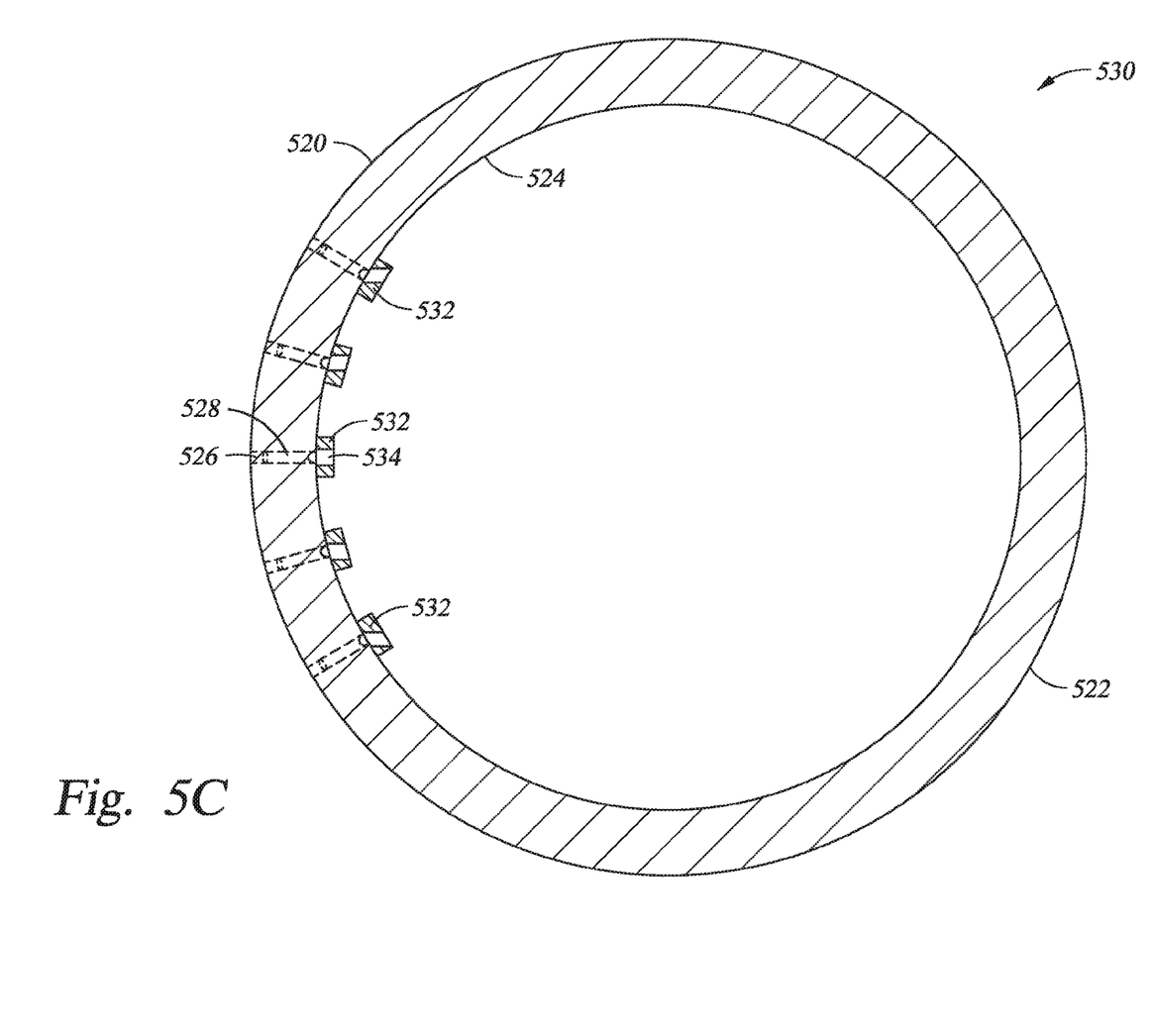
FIG. 5C is a schematic partial top view of a liner assembly according to another embodiment of the present disclosure.

FIG. 5C is a schematic partial top view of a liner assembly 530 according to another embodiment of the present disclosure. The liner assembly 530 is similar to the liner assembly 500 except the liner assembly 530 includes a plurality of discreet inject blocks 532 having horizontal channels 534 formed therein.

While the foregoing is directed to embodiments of the present disclosure, other and further embodiments of the disclosure may be devised without departing from the basic scope thereof, and the scope thereof is determined by the claims that follow.

What is claimed is:

1. A liner assembly for protecting an inner surface of a substrate process chamber, comprising:
    a lower liner having a ring shaped body with an outer surface and an inner surface defining a processing volume, the ring shaped body having a plurality of gas passages therethrough, the plurality of gas passages connecting the outer surface to the processing volume, wherein each of the plurality of gas passages comprises a horizontal portion connected to a vertical portion, wherein the horizontal portion opens to the outer surface of the ring shaped body, and wherein the vertical portion has an upper end open to an upper surface of the ring shaped body and a lower end connected to the horizontal portion; and
    an upper liner disposed above the ring shaped body, the upper liner including a plurality of flow guides aligned with the plurality of gas passages.

2. A liner assembly for protecting an inner surface of a substrate process chamber, comprising:
    a lower liner having a ring shaped body with an outer surface and an inner surface defining a processing volume, the ring shaped body having a plurality of gas passages therethrough, the plurality of gas passages connecting the outer surface to the processing volume; and
    an upper liner disposed above the ring shaped body, the upper liner including a plurality of flow guides aligned with the plurality of gas passages, wherein the upper liner includes a ring shaped body having a lip extending radially inward.

3. The liner assembly of claim 2, wherein the lip defines a central opening.

4. The liner assembly of claim 2, wherein the lip is positioned away from the lower liner.

5. The liner assembly of claim 2, wherein the ring shaped body of the upper liner has a curved inner surface facing the lower liner.

6. The liner assembly of claim 5, wherein the plurality of flow guides are formed in the inner surface.

7. A liner assembly for protecting an inner surface of a substrate process chamber, comprising:
    a liner body having a ring shaped body with an outer surface and an inner surface, the ring shaped body having a plurality of horizontal channels connecting a plurality of slanted channels; and an inject ring attached to the inner surface of the ring shaped body, the inject ring having a plurality of horizontal channels formed therethrough, each of the plurality of horizontal channels aligning with and connecting to one of the plurality of slanted channels.

8. The liner assembly of claim 7, wherein the plurality of horizontal channels formed through the inject ring are parallel to one another.

9. The liner assembly of claim 7, further comprising a plurality of inject blocks coupled to the inner surface of the ring shaped body, wherein each inject block includes a horizontal channel formed therethrough, and the horizontal channel in each inject block is aligned with one of the plurality of slanted channels.

10. The liner assembly of claim 9, wherein the horizontal channels formed through the inject blocks are parallel to one another.

11. A method for processing a substrate, comprising:
directing radiant energy from a plurality of heating elements towards an enclosure of a substrate processing chamber; and
tuning a flow of process gas using a plurality of gas passages formed in a liner assembly disposed in the process chamber, wherein the liner assembly comprises a ring shaped body with an outer surface and an inner surface defining a processing volume, the ring shaped body including a plurality of gas passages connecting the outer surface to the processing volume, and an upper liner disposed above the ring shaped body, the upper liner including a plurality of flow guides aligned with the plurality of gas passages.

12. The method of claim 11, wherein tuning the flow of process gas comprises directing the flow through a plurality of slanted channels.

* * * * *